United States Patent
Somani et al.

(10) Patent No.: US 10,036,272 B2
(45) Date of Patent: *Jul. 31, 2018

(54) PROVIDING POWER TO A DATA CENTER

(71) Applicant: Google LLC, Mountain View, CA (US)

(72) Inventors: Ankit Somani, Sunnyvale, CA (US);
Christopher G. Malone, Mountain View, CA (US)

(73) Assignee: Google LLC, Mountain View, CA (US)

( * ) Notice: Subject to any disclaimer, the term of this patent is extended or adjusted under 35 U.S.C. 154(b) by 118 days.

This patent is subject to a terminal disclaimer.

(21) Appl. No.: 15/175,857

(22) Filed: Jun. 7, 2016

(65) Prior Publication Data
US 2016/0290154 A1   Oct. 6, 2016

Related U.S. Application Data

(63) Continuation of application No. 14/286,548, filed on May 23, 2014, now Pat. No. 9,382,817.

(51) Int. Cl.
*F01D 15/10* (2006.01)
*H02K 7/18* (2006.01)
(Continued)

(52) U.S. Cl.
CPC .............. *F01D 15/10* (2013.01); *F01K 3/08* (2013.01); *F01K 3/12* (2013.01); *F01K 3/14* (2013.01);
(Continued)

(58) Field of Classification Search
CPC .. F01D 15/10; H05K 7/2079; H05K 7/20827; H05K 7/20836; H05K 7/20763; H02K 7/1823; F01K 13/02; F01K 25/00; F01K 3/08; F01K 3/12; F01K 3/14; F01K 15/00; F28F 27/02; F02C 1/04
(Continued)

(56) References Cited

U.S. PATENT DOCUMENTS

| 8,146,374 B1 | 4/2012 | Zien |
| 8,223,495 B1 | 7/2012 | Carlson et al. |

(Continued)

FOREIGN PATENT DOCUMENTS

| CN | 101501599 | 8/2009 |
| CN | 103814199 | 5/2014 |

(Continued)

OTHER PUBLICATIONS

Office Action issued in Chinese Application No. 201580025551.6, dated Jun. 8, 2017, 14 pages (with English translation).
(Continued)

*Primary Examiner* — Hoang Nguyen
(74) *Attorney, Agent, or Firm* — Fish & Richardson P.C.

(57) ABSTRACT

Techniques for providing power to a data center includes transferring heat from a computer data center to warm a fluid stored within an energy regeneration system; circulating the warmed fluid to a flow of compressed gas stored within the energy regeneration system during a discharging process that expands the compressed gas; generating energy with the energy generation system from the discharging process; and providing at least a portion of the generated energy to the computer data center as electrical power.

21 Claims, 5 Drawing Sheets

(51) Int. Cl.
*H05K 7/20* (2006.01)
*F01K 15/00* (2006.01)
*F02C 1/04* (2006.01)
*F28F 27/02* (2006.01)
*F01K 3/08* (2006.01)
*F01K 3/12* (2006.01)
*F01K 3/14* (2006.01)
*F01K 13/02* (2006.01)
*F01K 25/00* (2006.01)

(52) U.S. Cl.
CPC .............. *F01K 13/02* (2013.01); *F01K 15/00* (2013.01); *F01K 25/00* (2013.01); *F02C 1/04* (2013.01); *F28F 27/02* (2013.01); *H02K 7/1823* (2013.01); *H05K 7/2079* (2013.01); *H05K 7/20763* (2013.01); *H05K 7/20827* (2013.01); *H05K 7/20836* (2013.01)

(58) Field of Classification Search
USPC ............ 60/650, 682–684; 62/259.2; 361/700
See application file for complete search history.

(56) References Cited

U.S. PATENT DOCUMENTS 9,382,817 B2 * 7/2016 Somani .................. F01K 15/00
2009/0097205 A1    4/2009 Matsushima et al.
2010/0024445 A1    2/2010 Cichanowicz
2010/0076613 A1    3/2010 Imes
2010/0146996 A1 *  6/2010 Campbell ............ H05K 7/2079
                                                    62/119
2011/0172835 A1    7/2011 Imes
2013/0245847 A1    9/2013 Steven et al.
2013/0346139 A1   12/2013 Steven et al.
2014/0039965 A1    2/2014 Steven et al.

FOREIGN PATENT DOCUMENTS

WO    WO2008151888 A1    12/2008
WO    WO2012122004 A1    9/2012

OTHER PUBLICATIONS

Lightsail, Jesse Lefkowitz & Revolution in Design, retrieved from http://www.revolutionindesign.com, last accessed on Apr. 24, 2014, 3 pages.

International Search Report and Written Opinion in International Application No. PCT/US2015/030122, dated Sep. 25, 2015, 11 pages.

* cited by examiner

PROVIDING POWER TO A DATA CENTER

CROSS-REFERENCE TO RELATED APPLICATIONS

This application is a continuation of U.S. patent application Ser. No. 14/286,548, entitled "PROVIDING POWER TO A DATA CENTER," filed May 23, 2014, which is incorporated herein by reference in its entirety.

TECHNICAL FIELD

This disclosure relates to systems and methods for providing power to a data center, such as, providing power by recycling waste heat generated within a computer data center.

BACKGROUND

Computer users often focus on the speed of computer microprocessors (e.g., megahertz and gigahertz). This speed often comes with a cost—higher power consumption. For one or two home PCs, this extra power may be negligible when compared to the cost of running the many other electrical appliances in a home. But in data center applications, where thousands of microprocessors may be operated, electrical power requirements can be very important.

Power consumption has at least a two-fold effect on costs. Not only must a data center operator pay for electricity to operate its many computers, but the operator must also pay to cool the computers. A pair of microprocessors mounted on a single motherboard can draw hundreds of watts or more of power, which, in turn, produces heat. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

SUMMARY

In a general implementation, a method of providing power to a data center includes transferring heat from a computer data center to warm a fluid stored within an energy regeneration system; circulating the warmed fluid to a flow of compressed gas stored within the energy regeneration system during a discharging process that expands the compressed gas; generating energy with the energy generation system from the discharging process; and providing at least a portion of the generated energy to the computer data center as electrical power.

In a first aspect combinable with the general implementation, the heat includes waste heat generated from electronic devices within the computer data center.

In a second aspect combinable with any of the previous aspects, the heat is captured in an airflow circulated over servers within the computer data center to receive the heat generated by the electronic devices.

A third aspect combinable with any of the previous aspects further includes compressing an ambient airflow with a first charger-discharger of the energy regeneration system to produce the compressed gas.

A fourth aspect combinable with any of the previous aspects further includes expanding the compressed gas with the first charger-discharger of the energy regeneration system.

A fifth aspect combinable with any of the previous aspects further includes expanding the compressed gas with a second charger-discharger of the energy regeneration system.

In a sixth aspect combinable with any of the previous aspects, the fluid includes water or glycol.

In a seventh aspect combinable with any of the previous aspects, circulating the warmed fluid to the flow of compressed gas includes spraying the warmed fluid into the flow of compressed gas.

In an eighth aspect combinable with any of the previous aspects, transferring the heat from the computer data center to the fluid stored within the energy regeneration system includes transferring the heat from the computer data center to a heat pump as low grade heat.

In a ninth aspect combinable with any of the previous aspects, heat is transferred from the heat pump to the fluid stored within the energy regeneration system as high grade heat.

In a tenth aspect combinable with any of the previous aspects, the heat is transferred to a refrigerant within the heat pump.

In another general implementation, a data center energy regeneration system includes a stored energy system including a charger-discharger operable to expand a compressed gas that is stored within the stored energy system and generate energy while expanding the compressed gas, and provide at least a portion of the generated energy to a computer data center as electrical power; a heat pump operable to transfer heat from the computer data center to a fluid stored within the stored energy system to warm the fluid; and a pump positioned to circulate the heated fluid to a flow of the compressed gas.

In a first aspect combinable with the general implementation, the computer data center includes servers including electronic devices that generate the heat as waste heat; and fans positioned to circulate an airflow over the electronic devices to capture the waste heat.

In a second aspect combinable with any of the previous aspects, the charger-discharger is operable to compress an ambient airflow to produce the compressed gas.

In a third aspect combinable with any of the previous aspects, the charger-discharger is a first charger-discharger, and wherein the stored energy system further includes a second charger-discharger operable to compress an ambient airflow to produce the compressed gas.

In a fourth aspect combinable with any of the previous aspects, the fluid includes water or glycol.

A fifth aspect combinable with any of the previous aspects further includes a nozzle that is positioned to spray the heated fluid into the flow of the compressed gas while the compressed gas is expanded.

In a sixth aspect combinable with any of the previous aspects, the heat pump is operable to transfer the heat from the computer data center as low grade heat.

In a seventh aspect combinable with any of the previous aspects, the heat pump is operable to transfer heat to the fluid stored within the energy regeneration system as high grade heat.

In an eighth aspect combinable with any of the previous aspects, the heat pump is operable to transfer the heat from the computer data center to a refrigerant within the heat pump.

In another general implementation, a data center energy regeneration system includes a stored energy system; a heat pump fluidly coupled to the stored energy system; and a controller electrically coupled to the stored energy system and to the heat pump, operable to control the stored energy system to expand a compressed gas that is stored within the stored energy system, generate energy while expanding the compressed gas, and provide at least a portion of the generated energy to a computer data center as electrical power, control the heat pump to transfer heat from the computer data center to a fluid stored within the stored energy system to warm the fluid, and control a pump to circulate the fluid, after the fluid is warmed, to a flow of the compressed gas while the compressed gas is expanded.

In a first aspect combinable with the general implementation, the stored energy system includes a charger-discharger, and the controller is operable to control the charger-discharger to expand the compressed gas.

In a second aspect combinable with any of the previous aspects, the controller is operable to control the charger-discharger to compress an ambient airflow to produce the compressed gas.

In a third aspect combinable with any of the previous aspects, the computer data center includes servers including electronic devices that generate the heat as waste heat.

In a fourth aspect combinable with any of the previous aspects, the controller is operable to control fans to circulate an airflow over the electronic devices to capture the waste heat.

In a fifth aspect combinable with any of the previous aspects, the controller is further operable to control a nozzle to spray the fluid, after the fluid is warmed, into the flow of the compressed gas while the compressed gas is expanded.

In a sixth aspect combinable with any of the previous aspects, the controller is further operable to control the heat pump to transfer the heat from the computer data center as low grade heat.

In a seventh aspect combinable with any of the previous aspects, the controller is further operable to control the heat pump to transfer heat to the fluid stored within the energy regeneration system as high grade heat.

In an eighth aspect combinable with any of the previous aspects, the controller is further operable to control the heat pump to transfer the heat from the computer data center to a refrigerant within the heat pump.

Various implementations of the systems and methods for providing power to a data center may include one or more of the following features. For example, an energy regeneration system of a data center power system can recycle heat (e.g., waste heat) generated within the computer data center to provide power to the computer data center. The energy regeneration system may distribute power in parallel to the power distributed by the data center electrical station. Accordingly, the power distributed by the energy regeneration system may provide power that is backup, supplemental, or alternative to the power provided by a data center electrical station. As another example, the energy regeneration system operates in an "always-on" mode during which both charger-dischargers operate continuously, such that the energy regeneration system can continuously provide power to the computer data center.

As a further example, a heat pump of the energy regeneration system increases the efficiency of the energy storage system. For example, for a particular amount of relatively high temperature waste heat provided by the heat pump and a particular temperature of the waste heat, the amount of energy provided a the stored energy system of the energy regeneration system to the computer data center is greater than the amount of energy provided to a charger-discharger of the stored energy system that serves as a compressor. In this manner, the energy regeneration system can generate "net" electricity, thereby reducing the price of electricity for powering the computer data center when the energy regeneration system is operating in the "always on" mode. As another example, in an "off" mode, the energy regeneration system may be unidirectional and continue to supply backup power, hence obviating a need for other backup power sources, especially those that may generate pollution, such as diesel generators.

These general and specific aspects may be implemented using a device, system, method, or any combinations of devices, systems, or methods. For example, a system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

DETAILED DESCRIPTION

A power distribution system that includes an energy regeneration system may be utilized to power all or a portion of a data center. The power distribution system may power the data center by transferring waste heat from the data center to the energy regeneration system, where the waste heat is recycled to generate energy that is then provided as electricity to the data center.

Figure 1:
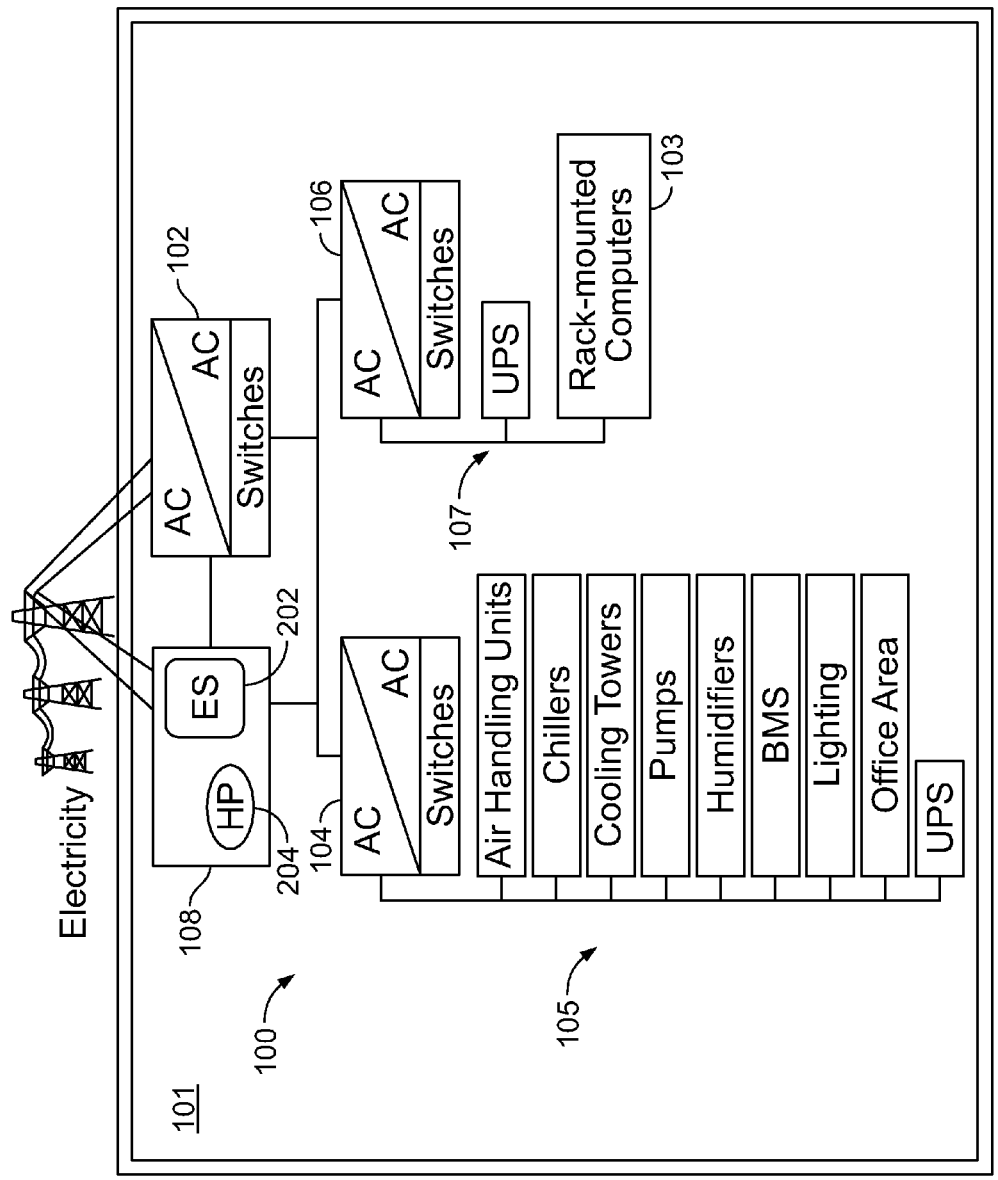
FIG. 1 illustrates an example power distribution system for a computer data center.

FIG. 1 illustrates an example power distribution system 100 for a computer data center 101. The computer data center 101 is a building (e.g., modular, built-up, container-based, or otherwise) that houses multiple rack-mounted computers 103 and other power-consuming components (e.g., power loads that consume overhead energy) that support (e.g., directly or indirectly) operation of the rack-mounted computers 103. The computer data center 101 further includes a control system that is communicably (e.g., electrically) coupled to the power distribution system 100, to the rack-mounted computers 103, and to the other power-consuming components of the data center.

As illustrated, the power-consuming components include data center infrastructure components 105 and IT components 107. Example infrastructure components 105 include components associated with a data center cooling system (e.g., air handling units, chillers, cooling towers, pumps, and humidifiers), components associated with a data center lighting system, and components associated with a data center building management system (e.g., office air conditioning (AC) and other equipment and uninterruptible power supplies). Example IT components 107 include components associated with the rack-mounted computers 103 (e.g., uninterruptible power supplies). In some implementations, one or more of the components associated with the data center cooling system (e.g., the chillers, cooling towers, fans, valves, condensing units, pumps, condensers, and otherwise) may represent the largest portion of the overhead energy consumed by the power-consuming components. In some examples, a smaller portion of the overhead energy may be consumed by one or more of the components associated with the data center lighting system and/or one or more of the components associated with the data center building management system.

In some implementations, power consumed by the various components of the computer data center 101 can vary over time. In some examples, power consumed by the infrastructure components 105 may vary considerably over time due to fluctuations in ambient temperatures external to the computer data center 101. For example, an unusually warm weather day may cause one or more of the infrastructure components 105 to consume an unusually high amount of power. In some examples, power consumed by the rack-mounted computers 103 and/or the IT components 107 may vary considerably over time due to workload variations. For example, an unusually high number of requests received by the computer data center 101 may cause one or more of the rack-mounted computers 103 and/or one or more of the IT components 107 to consume an unusually high amount of power.

In some implementations, the power distribution system 100 may monitor and control a distribution of power among the various components of the computer data center 101. As illustrated, the power distribution system 100 includes a data center electrical station 102 (e.g., a main electrical station), which draws a specified amount of power from one or more external electrical towers.

The power distribution system 100 further includes an energy regeneration system 108 that, in some aspects, can recycle heat (e.g., waste heat) generated within the computer data center 101 to provide power to the computer data center 101. The energy regeneration system 108 may draw a specified amount of power from the one or more electrical towers and/or from the data center electrical station 102. In some implementations, the energy regeneration system 108 includes an energy storage system (ES 202) and a heat pump (HP 204) that may be implemented to distribute power (e.g., electricity at 4160 VAC, 480 VAC, 120 VAC or even direct current (DC) power such as 110 VDC) to each of the infrastructure substation 104 and the IT substation 106. The energy regeneration system 108 may distribute power in parallel to the power distributed by the data center electrical station 102. Accordingly, the power distributed by the energy regeneration system 108 may provide power that is backup, supplemental, or alternative to the power provided by the data center electrical station 102.

The power distribution system 100 further includes a data center infrastructure substation 104 that provides power to the infrastructure components 105, and a data center IT substation 106 that provides power to the rack-mounted computers 103 and to the IT components 107. The data center electrical station 102, the energy regeneration system 108, the infrastructure substation 104, and the IT substation 106 are all coupled to one another via multiple power busses that are electrically coupled to one or more of the rack-mounted computers 103, to one or more of the infrastructure components 105, and/or to one or more of the IT components 107. The power busses may be located within any of the data center electrical station 102, the energy regeneration system 108, the infrastructure substation 104, and the IT substation 106. Such coupling among the rack-mounted computers 103, the infrastructure components 105, and the IT components 107 provides that, at a particular time, the total power capacity of the computer data center 101 may be available to a subset of one or more of the components (e.g., any of the rack-mounted computers 103, the power components 105, or the IT components 107) of the computer data center 101.

The data center electrical station 102 includes an input device, transformers, and switches that can receive high voltage (e.g., 13.5 kV) electricity from one or more external electrical sources (e.g., towers) and distribute an appropriate (e.g., reduced) amount of power (e.g., electricity at 4160 VAC, 480 VAC, 120 VAC or even direct current (DC) power such as 110 VDC) to each of the infrastructure substation 104 and the IT substation 106.

In some implementations, the infrastructure substation 104 includes transformers and switches that can receive an appropriate amount of power (e.g., electricity at 4160 VAC) from the data center electrical station 102 and/or the energy regeneration system 108 and distribute an appropriate (e.g., reduced) amount of power (e.g., electricity at 120-480 VAC) to the various infrastructure components 105 of the data center 101. The IT substation 106 includes transformers and switches that can receive an appropriate amount of power (e.g., electricity at 4160 VAC) from the data center electrical station 102 and/or the energy regeneration system 108 and distribute an appropriate (e.g., reduced) amount of power (e.g., electricity at 120-480 VAC) to the various IT components 107 of the data center 101.

In cases where a peak power capacity (e.g., a sum of a peak power capacity of the infrastructure components 105 and a peak power capacity of the IT components 107) is predicted, the infrastructure substation 104 may be throttled, or may be supplemented by the energy regeneration system 108, or may even be taken offline in favor of the energy regeneration system 108 in order to prevent such a situation from occurring. In some implementations, the power distribution system 100 manages peak power consumption of the rack-mounted computers 103 and/or the IT components 107 by throttling the infrastructure substation 104, supplementing the substation 104 by the energy regeneration system 108, and/or replacing (e.g., electrically) the substation 104 with the energy regeneration system 108 to adjust the amount of power consumed by the infrastructure components 105. For example, the power distribution system 100 may reduce the amount of power distributed to the infrastructure substation 104 from the data center electrical station 102 and/or the energy regeneration system 108 and/or redistribute power from the infrastructure substation 104 to the IT substation 106.

In some implementations, the power distribution system 100 can be set to a static constant maximum allowed power, and this could be altered (e.g., manually or otherwise) when required or desired. For example, the data center electrical station 102 and the energy regeneration system 108 may be controlled to provide a predetermined (e.g., substantially constant) amount of power to the infrastructure substation 104 except during predetermined times during which the IT substation 106 is expected to consume peak levels of power. In some implementations, the power distribution system 100 can be dynamically controlled. For example, the control system may begin to throttle the infrastructure substation 104, supplement the substation 104 by the energy regeneration system 108, and/or replace (e.g., electrically) the substation 104 with the energy regeneration system 108 before the one or more incoming requests are received by the computer data center 101 (or, e.g., implemented by the rack-mounted computers 103) and accordingly increase the power distributed to the IT substation 106.

Figure 2:
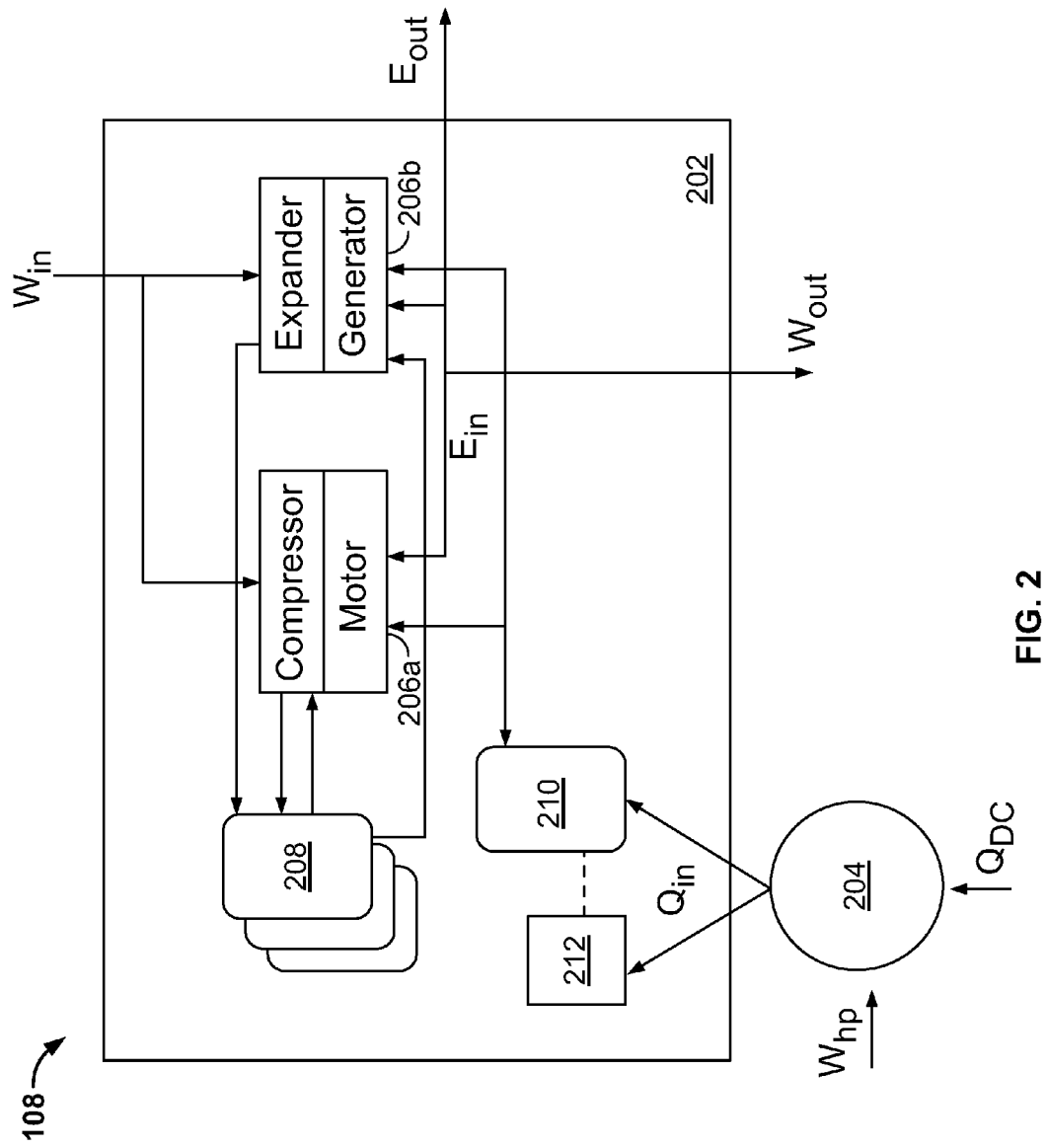
FIG. 2 is a schematic diagram showing an energy regeneration system for powering a computer data center.

FIG. 2 is a schematic diagram showing an energy regeneration system 108 for powering the computer data center 101. The example energy regeneration system 108 may be used to power operation (e.g., steady state operation, peak operation, or otherwise) of the computer data center 101 by recycling waste heat generated within the computer data center 101. The energy regeneration system 108 may include an energy storage system 202 (e.g., an isothermal, compressed air energy storage system (CAES)) and a heat pump 204 that provides waste heat from the computer data center 101 to the energy storage system 202.

In some implementations, the energy storage system 202 includes two charger-dischargers 206a, 206b that each act in a single direction (e.g., charging or discharging). In a "charging" mode, a particular charger-discharger 206a, 206b can act as a motor-compressor, in which, for instance, an electrical motor drives a compressor to compress a flow of a gas (e.g., ambient air). In a "discharging" mode, a particular charger-discharger 206a, 206b can act as a expander-generator, in which, for instance, an expander (e.g., turbine) is driven by a flow of the compressed gas (e.g., compressed air) to, in turn, drive a generator to generate electrical energy that can power the computer data center 101. In some aspects, either one of the charger-dischargers 206a, 206b may operate in the "charging" mode while the other of the charger-dischargers 206a, 206b can operate in the "discharging" mode, thereby ensuring a constant or substantially constant flow of energy from the "discharging" one of the charger-dischargers 206a, 206b (e.g., an "always on" mode). In some aspects, both of the charger-dischargers 206a, 206b may operate in the "charging" mode substantially simultaneously, and then, subsequently, may operate in the "discharging" mode substantially simultaneously, thereby resulting in a periodic flow of energy from the "discharging" charger-dischargers 206a, 206b (e.g., an "on-off" mode).

The charger-dischargers 206a, 206b may include ports that allow the charger-dischargers 206a, 206b to receive gas (e.g., from the ambient environment), as well as electrical components that allow the charger-dischargers 206a, 206b to receive electricity to compress and/or decompress the gas.

In some implementations, the energy storage system 202 further includes multiple gas tanks 208 that store gas compressed by either one of the charger-dischargers 206a, 206b and one or more water tanks 210 that store water (or another liquid, such as glycol) used during compression and discharging of the gas. As discussed above, one of the charger-dischargers 206a, 206b may receive gas from the ambient environment $E_{in}$ and receive electricity $W_{in}$ from the one or more external electrical towers and/or from the data center electrical station 102 for carrying out a process to compress the gas. Heat is generated during compression of the gas, and a portion of the generated heat may be transferred to a spray (e.g., a fine, dense mist) of water that is injected (e.g., via a pump and a nozzle) into the gas as the gas is being compressed. The injected water may be supplied from one or more of the water tanks 210 during the compression process. The spray of water may be recaptured as heated water that is then recirculated to the one or more water tanks 210 where it may be stored for later use during a discharging process. In some aspects, heat that is not captured by the spray of water may be transferred (e.g., expelled) to an ambient environment (e.g., through a cooling tower or otherwise).

Discharging of the stored compressed gas is carried out by the other one of the charger-dischargers 206a, 206b (e.g., in a "discharging" mode) and, in some aspects, may utilize the addition of heat. Such addition of heat for discharging of the gas as compared to the heat generated during compression of the gas may help determine an efficiency (e.g., round-trip efficiency) of the energy storage system 202. The heat may be provided by a spray (e.g., a fine, dense mist) of water that is injected (e.g., via a pump and a nozzle) into a flow of the stored gas as the gas is being decompressed. The injected water may be supplied from one or more of the water tanks 210 during the discharging process. In some aspects, although the injected water may not be heated, e.g., there may not be an addition of heat for discharging of the gas, but there may be an increase in pressure (e.g., in tanks 210). Thus, a result of higher stored energy (e.g., through higher temperature and/or higher pressure) may be achieved.

All or portions of the injected water may be recaptured for recirculation to the water tanks 210 and/or be evaporated by the flow of gas without condensing and being recaptured. As the gas is decompressed, energy may be generated (e.g., by an expander-generator mode of the charger-dischargers 206a, 206b), and excess energy, $E_{out}$, from the decompressed gas is released to the ambient environment from the energy regeneration system 108. The generated energy, $W_{out}$, may be provided as electricity to the computer data center 101 to power the computer data center 101.

As described above, in some implementations, the energy regeneration system 108 operates in an "always-on" mode during which both charger-dischargers 206a, 206b operate continuously, such that the energy regeneration system 108 can continuously provide power to the computer data center 101. In some implementations, both or only one of the charger-dischargers 206a, 206b operates for a particular period of time (e.g., In some implementations, an energy regeneration system may include only one of the charger-dischargers 206a, 206b, which can alternate between charging and discharging modes. In examples where an energy regeneration system operates in a charging only mode, the computer data center 101 may receive power directly from the data center electrical station 102. In some implementations, an energy regeneration system may include more than two of the charger-dischargers 206a, 206b, with any of the devices acting as the compressor/motor combination or as the expander/generator combination.

Figure 3A:
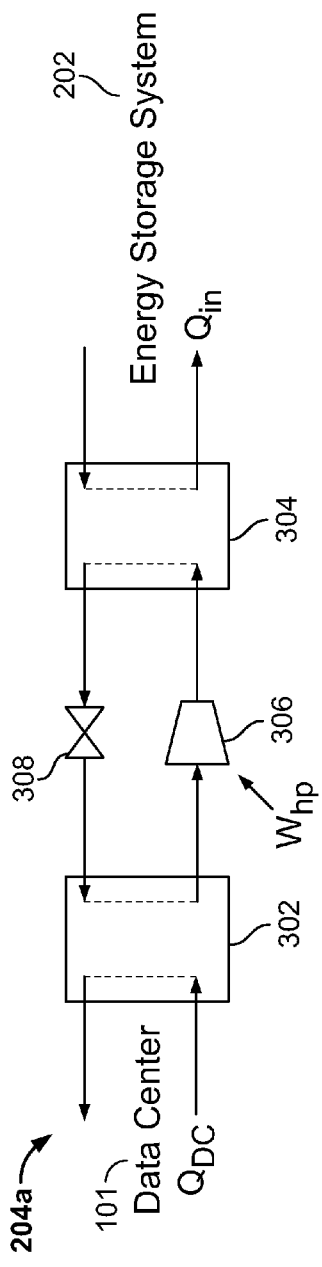
FIGS. 3A-3C are schematic diagrams showing example implementations of a heat pump of an energy regeneration system.
Figure 3B:
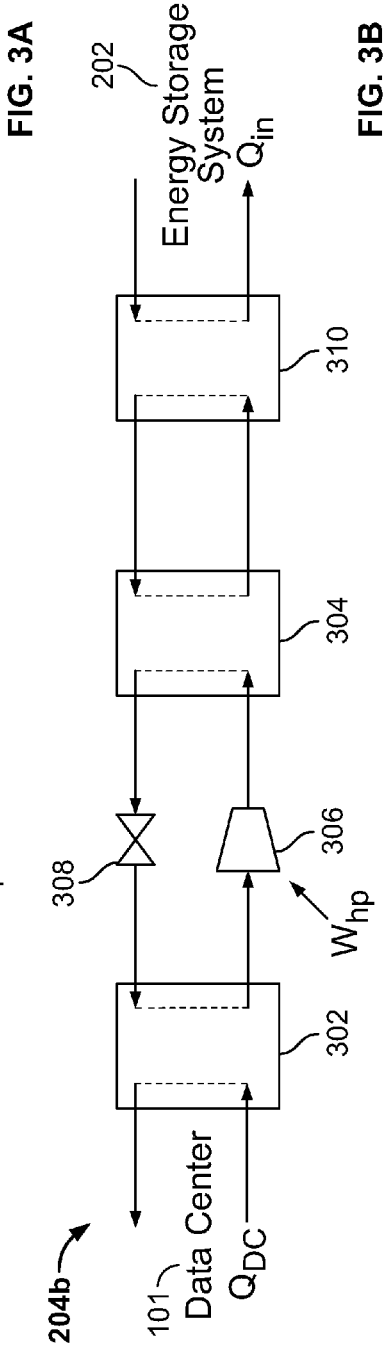
Figure 3C:
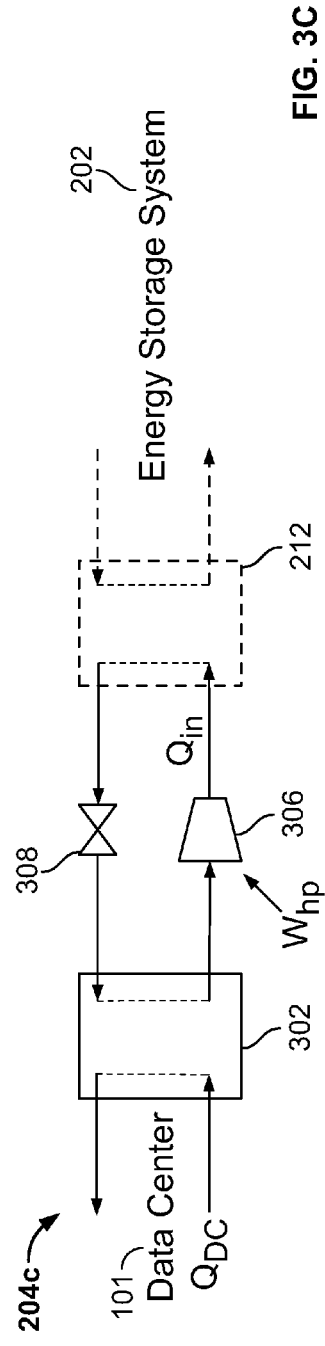

In some implementations, the energy storage system 202 may further include a heat exchanger 212 that is fluidly coupled to the one or more water tanks 210 and to the heat pump 204 (refer to FIG. 3C). A flow of relatively low temperature tank water from the one or more water tanks 210 and a flow of relatively high temperature refrigerant from the heat pump 204 may be circulated past one another within the heat exchanger 212. For example, the temperature of the water flowing from the one or more water tanks 210 to the heat exchanger 212 or to the heat pump 204 (as discussed with respect to FIGS. 3A and 3B) may be greater than the temperature of the water flowing from the heat exchanger 212 or from the heat pump 204 to the one or more water tanks 210. Such a temperature differential may result from heat $Q_{in}$ being transferred from a working fluid within the heat pump 204 to the tank water as it flows through the heat exchanger 212.

FIGS. 3A-3C are schematic diagrams of various implementations 204a, 204b, 204c of the example heat pump 204 of the energy regeneration system 108. In some implementations, the heat pump 204 provides heat $Q_{in}$ to the water in the one or more water tanks 210 or the heat exchanger 212 in order to increase the temperature of the water that is to be sprayed into the flow of gas during the discharging process and accordingly increase the efficiency of the energy storage system 202.

Referring to FIG. 3A, the heat pump 204a may include a first heat exchanger 302 that is fluidly coupled to the computer data center 101 and a second heat exchanger 304 that is fluidly coupled to the one or more water tanks 210 of the stored energy system 202. The first heat exchanger may receive a flow of warmed water (e.g., carrying relatively low temperature waste heat, $Q_{DC}$) circulated from the computer data center 101 by a pump (e.g., pump 424 shown in FIG. 4) and a flow of a working fluid (e.g., a refrigerant, such as HFC, HCFC, blended refrigerant, ammonia, or other refrigerant) that transfers heat from the warmed water to provide cooling water that is circulated from the first heat exchanger 302 back to the computer data center 101.

The second heat exchanger 304 may receive a flow of water pumped from the one or more water tanks 210 of the energy storage system 202 and the flow of the working fluid, which transfers heat to the water to increase the temperature of the water (e.g., now carrying relatively high temperature waste heat, $Q_{in}$) that is circulated from the second heat exchanger 304 back to the one or more water tanks 210. $Q_{in}$, in some aspects, is a relatively higher temperature heat (e.g., high grade heat) compared to $Q_{DC}$. From the one or more water tanks 210, the water may be injected into the flow of stored gas during the discharging process.

The heat pump 204a may further include a compressor 306 that receives electricity $W_{hp}$ to operate on the working fluid (e.g., in a vapor compression cycle). For example, the working fluid may enter the compressor 306 as a low temperature, low pressure vapor and exit the compressor 306 as a high temperature, high pressure vapor. The high temperature, high pressure vapor may be circulated from the compressor 306 to the second heat exchanger 304, where the vapor transfers heat from the flow of water (e.g., from the stored energy system 202) circulating through the second heat exchanger 304. Such heat transfer causes the vapor to condense to a high pressure, low temperature liquid as it exits the second heat exchanger 304. The liquid may be circulated from the second heat exchanger 304 to the expansion valve 308, where the pressure of the liquid is quickly reduced. The low temperature, low pressure liquid may be circulated from the expansion valve 308 to the first heat exchanger 302, where the liquid transfers heat from the flow of water (e.g., from the computer data center 101) circulating through the first heat exchanger 302. Such heat transfer causes the liquid to evaporate to a high temperature, high pressure vapor. The vapor may then circulate from the first heat exchanger 302 to the compressor 306 in a continuous fluid loop.

Referring to FIG. 3B, the heat pump 204b may include the first and second heat exchangers 302, 304, the compressor 306, and the expansion valve 308, which may act on the flow of warmed water circulated from the computer data center 101 and the working fluid in the same manner as that described with respect to the heat pump 204a. The heat pump 204b may further include a third heat exchanger 310 that is fluidly coupled to the one or more water tanks 210 of the stored energy system 202. The third heat exchanger 310 may receive the flow of water circulated from the one or more water tanks 210, and a flow of water (or another liquid, such as glycol) circulated from the second heat exchanger 304. Within the second heat exchanger 304, the working fluid may transfer heat to the flow of water circulated between the second and third heat exchangers 304, 310. Within the third heat exchanger 310, the flow of water circulated between the second and third heat exchangers 304, 310 may transfer heat to the tank water to increase the temperature of the tank water (e.g., now carrying relatively high temperature waste heat, $Q_{in}$) that is circulated from the third heat exchanger 310 back to the one or more water tanks 210.

From the one or more water tanks 210, the tank water may be injected into the flow of stored gas during the discharging process. For example, in some cases, the additional fluid loop (e.g., including the heat exchanger 310 fluidly coupled to the water tanks 210) may be useful when the heat pump 204b is relatively far away from the energy regeneration system 108. By providing an additional fluid loop, a more reliable and/or efficient (e.g., lower costs on piping and/or pumping) manner of transporting energy (e.g., a heated fluid) to the tanks 210 is provided.

Referring to FIG. 3C, the heat pump 204c may include the first heat exchanger 302, the compressor 306, and the expansion valve 308, which may act on the flow of warmed water circulated from the computer data center 101 and the working fluid in the same manner as that described with respect to the heat pump 204a. After being circulated through the first heat exchanger 302 and being further warmed in the compressor 306, the working fluid may be circulated through the heat exchanger 212 of the stored energy system 202, where the working fluid transfers heat to the tank water (e.g., now carrying relatively high temperature waste heat, $Q_{in}$) circulated back to the one or more water tanks 210. From the one or more water tanks 210, the tank water may be injected into the flow of stored gas during the discharging process.

While the various components (e.g., the heat exchangers 302, 304, 310, the compressor 306, and the expansion valve 308) of the heat pumps 204a, 204b, 204c are illustrated separately from the energy storage system 202, in some implementations, any of these components may be alternatively integral with (e.g., located within a housing of) the energy storage system 202.

Figure 4:
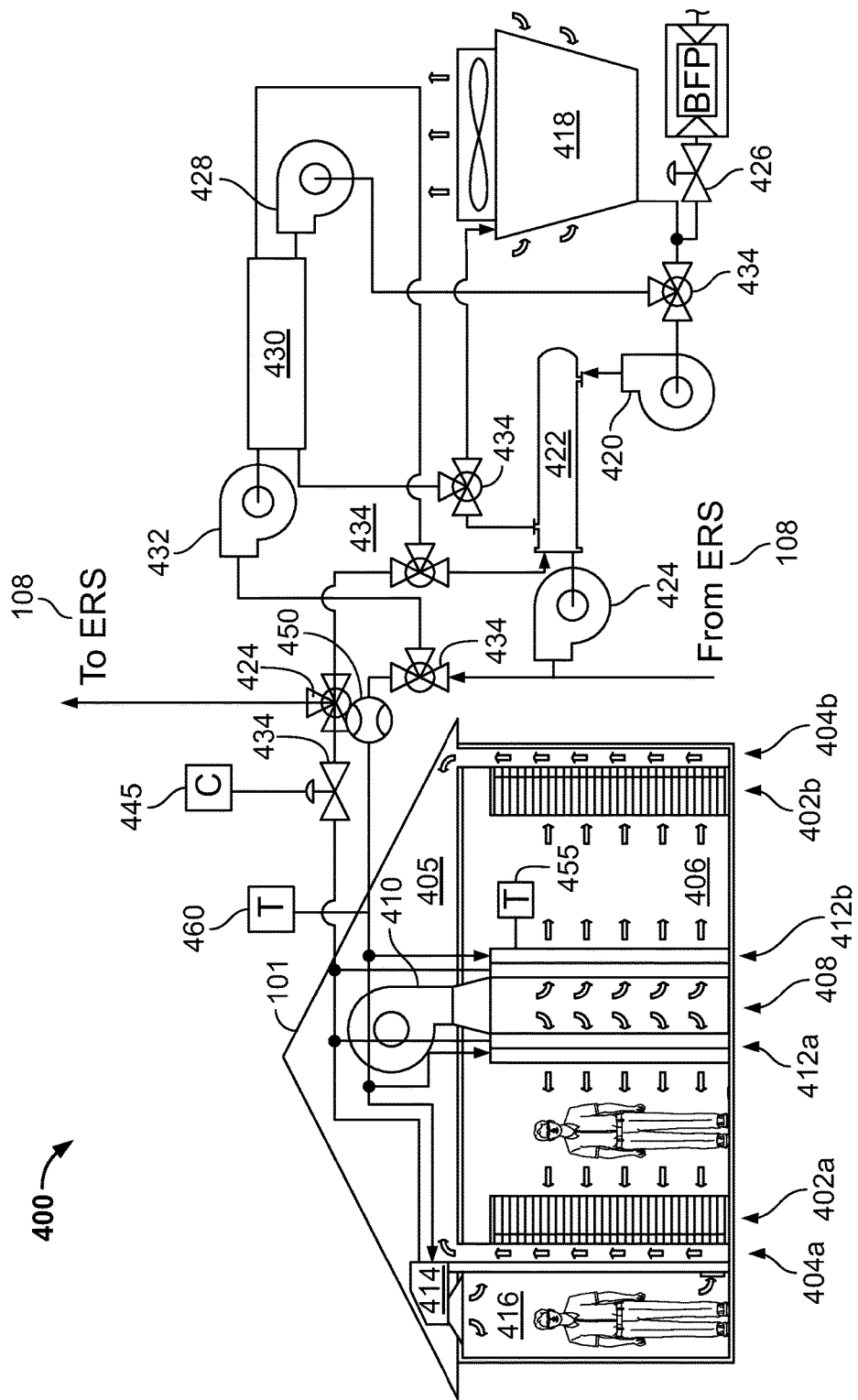
FIG. 4 is a schematic diagram showing a system for cooling a computer data center.

FIG. 4 illustrates a schematic diagram showing an example system 400 for cooling the computer data center 101. As discussed above with respect to FIG. 1, the computer data center 101 is a building that houses the rack-mounted computers 103, the infrastructure components 105, and/or the IT components 107 and includes the power distribution system 100 and the control system. The example system 400 may be used to capture heat (e.g., waste heat) from the computer data center 101. In some examples, such heat may be generated by computing equipment (e.g., servers, switches, processors, network equipment, etc.) within the computer data center 101. In some cases, such heat may additionally be generated by other sources, such as an industrial process occurring at the computer data center 101 or waste heat that is accessible to the computer data center 101.

In some implementations, the computer data center 101 includes infrastructure components such as a chiller 430, pumps 428, 432, a fan 410, and valves 440, which will be described in more detail below. Such infrastructure components may be throttled to reduce their power consumption. For example, the power consumption of the chiller 430 may be reduced via a variable frequency drive, current limiting, powering off the chiller 430, or raising a chilled temperature of water exiting the chiller 430. In some examples, the power consumption of the pumps 428, 432 or the fan 410 may be reduced via a variable frequency drive, a two-speed motor, or powering off.

In some implementations, the system 400 may implement static approach control and/or dynamic approach control to, for example, control an amount of cooling fluid circulated to cooling modules (such as cooling coils 412*a* and 412*b*). For example, a cooling apparatus may be controlled to maintain a static or dynamic approach temperature that is defined by a difference between a leaving air temperature of the cooling apparatus and an entering cooling fluid temperature of the cooling apparatus. A workspace 406 is defined around the computers, which are arranged in a number of parallel rows and mounted in vertical racks, such as racks 402*a*, 402*b*. The racks may include pairs of vertical rails to which are attached paired mounting brackets (not shown). Trays containing computers, such as standard circuit boards in the form of motherboards, may be placed on the mounting brackets.

In one example, the mounting brackets may be angled rails welded or otherwise adhered to vertical rails in the frame of a rack, and trays may include motherboards that are slid into place on top of the brackets, similar to the manner in which food trays are slid onto storage racks in a cafeteria, or bread trays are slid into bread racks. The trays may be spaced closely together to maximize the number of trays in a data center, but sufficiently far apart to contain all the components on the trays and to permit air circulation between the trays.

Other arrangements may also be used. For example, trays may be mounted vertically in groups, such as in the form of computer blades. The trays may simply rest in a rack and be electrically connected after they are slid into place, or they may be provided with mechanisms, such as electrical traces along one edge, that create electrical and data connections when they are slid into place.

Air may circulate from workspace 406 across the trays and into warm-air plenums 404*a*, 404*b* behind the trays. The air may be drawn into the trays by fans mounted at the back of the trays (not shown). The fans may be programmed or otherwise configured to maintain a set exhaust temperature for the air into the warm air plenum, and may also be programmed or otherwise configured to maintain a particular temperature rise across the trays. Where the temperature of the air in the work space 406 is known, controlling the exhaust temperature also indirectly controls the temperature rise. The work space 406 may, in certain circumstances, be referenced as a "cold aisle," and the plenums 404*a*, 404*b* as "warm aisles."

The temperature rise can be large. For example, the work space 406 temperature may be between about 74-79° F. (e.g., about 77° F. (25° C.)) and the exhaust temperature into the warm-air plenums 404*a*, 404*b* may be set between 110-120° F. (e.g., about 113° F. (45° C.)), for about a 36° F. (20° C.)) rise in temperature. The exhaust temperature may also be between 205-220° F., for example, as much as 212° F. (100° C.) where the heat generating equipment can operate at such elevated temperature. For example, the temperature of the air exiting the equipment and entering the warm-air plenums 404*a*, 404*b* may be 118.4, 122, 129.2, 136.4, 143.6, 150.8, 158, 165, 172.4, 179.6, 186.8, 194, 201, or 208.4° F. (48, 50, 54, 58, 62, 66, 70, 74, 78, 82, 86, 90, 94, or 98° C.). Such a high exhaust temperature generally runs contrary to teachings that cooling of heat-generating electronic equipment is best conducted by washing the equipment with large amounts of fast-moving, cool air. Such a cool-air approach does cool the equipment, but it also uses lots of energy.

Cooling of particular electronic equipment, such as microprocessors, may be improved even where the flow of air across the trays is slow, by attaching impingement fans to the tops of the microprocessors or other particularly warm components, or by providing heat pipes that circulate cooling liquid (e.g., cooling water) to such components and related heat exchangers for such components. For example, within the heat pipes, such cooling liquid may transfer heat (e.g., waste heat) from the components while flowing through the components. The heated liquid may be circulated to the energy regeneration system 108 (e.g., to the heat pump 204), where the heated liquid may be used (e.g., recycled) to generate power that can be provided to the computer data center 101. A controlled mixing valve 434 is provided for electronically controlling the amount of heated liquid that is provided to the energy regeneration 108. Within the energy regeneration system 108, the heated liquid is cooled and then circulated back to the computer data center 101 as cooling liquid.

The heated air circulated across the trays and into the warm-air plenums 404*a*, 404*b* may be routed upward into a ceiling area, or attic 405, or into a raised floor or basement, or other appropriate space, and may be gathered there by air handling units that include, for example, fan 410, which may include, for example, one or more centrifugal fans appropriately sized for the task. The fan 410 may then deliver the air back into a plenum 408 located adjacent to the workspace 406. The plenum 408 may be simply a bay-sized area in the middle of a row of racks, that has been left empty of racks, and that has been isolated from any warm-air plenums on either side of it, and from cold-air work space 406 on its other sides. Alternatively, air may be cooled by coils defining a border of warm-air plenums 404*a*, 404*b* and expelled directly into workspace 406, such as at the tops of warm-air plenums 404*a*, 404*b*.

Cooling coils 412*a*, 412*b* may be located on opposed sides of the plenum approximately flush with the fronts of the racks. (The racks in the same row as the plenum 408, coming in and out of the page in the figure, are not shown.) The coils may have a large surface area and be very thin so as to present a low pressure drop to the system 400. In this way, slower, smaller, and quieter fans may be used to drive air through the system. Protective structures such as louvers or wire mesh may be placed in front of the coils 412*a*, 412*b* to prevent them from being damaged.

In operation, fan 410 pushes air down into plenum 408, causing increased pressure in plenum 408 to push air out through cooling coils 412*a*, 412*b*. As the air passes through the coils 412*a*, 412*b*, its heat (e.g., waste heat) is transferred into the cooling liquid in the coils 412*a*, 412*b*, and the air is cooled. The heated liquid may then be delivered to the energy regeneration system 108 (e.g. the heat pump 204), where the heated liquid may be used (e.g., recycled) to generate power that can be provided to the computer data center 101.

The speed of the fan 410 and/or the flow rate or temperature of cooling water flowing in the cooling coils 412*a*, 412*b* may be controlled in response to measured values. For example, the pumps driving the cooling liquid may be variable speed pumps that are controlled to maintain a particular temperature in work space 406. Such control mechanisms may be used to maintain a constant temperature in workspace 406 or plenums 404*a*, 404*b* and attic 405.

The workspace air may then be drawn into racks 402*a*, 402*b* such as by fans mounted on the many trays that are mounted in racks 402*a*, 402*b*. This air may be heated as it passes over the trays and through power supplies running the computers on the trays, and may then enter the warm-air plenums 404*a*, 404*b*. Each tray may have its own power supply and fan, with the power supply at the back edge of the tray, and the fan attached to the back of the power supply. All of the fans may be configured or programmed to deliver air at a single common temperature, such as at a set 113° F. (45° C.). The process may then be continuously readjusted as fan 410 captures and circulates the warm air.

Additional items may also be cooled using system 400. For example, room 416 is provided with a self-contained fan coil unit 414 which contains a fan and a cooling coil. The unit 414 may operate, for example, in response to a thermostat provided in room 416. Room 416 may be, for example, an office or other workspace ancillary to the main portions of the data center 401.

In addition, supplemental cooling may also be provided to room 416 if necessary. For example, a standard roof-top or similar air-conditioning unit (not shown) may be installed to provide particular cooling needs on a spot basis. As one example, system 400 may be designed to deliver 78° F. (25.56° C.) supply air to work space 406, and workers may prefer to have an office in room 416 that is cooler. Thus, a dedicated air-conditioning unit may be provided for the office. This unit may be operated relatively efficiently, however, where its coverage is limited to a relatively small area of a building or a relatively small part of the heat load from a building. Also, cooling units, such as chillers, may provide for supplemental cooling, though their size may be reduced substantially compared to if they were used to provide substantial cooling for the system 400.

Fresh air may be provided to the workspace 406 by various mechanisms. For example, a supplemental air-conditioning unit (not shown), such as a standard roof-top unit may be provided to supply necessary exchanges of outside air. Also, such a unit may serve to dehumidify the workspace 406 for the limited latent loads in the system 400, such as human perspiration. Alternatively, louvers may be provided from the outside environment to the system 400, such as powered louvers to connect to the warm air plenum 404b. System 400 may be controlled to draw air through the plenums when environmental (outside) ambient humidity and temperature are sufficiently low to permit cooling with outside air. Such louvers may also be ducted to fan 410, and warm air in plenums 404a, 404b may simply be exhausted to atmosphere, so that the outside air does not mix with, and get diluted by, the warm air from the computers. Appropriate filtration may also be provided in the system, particularly where outside air is used.

Also, the workspace 406 may include heat loads other than the trays, such as from people in the space and lighting. Where the volume of air passing through the various racks is very high and picks up a very large thermal load from multiple computers, the small additional load from other sources may be negligible, apart from perhaps a small latent heat load caused by workers, which may be removed by a smaller auxiliary air conditioning unit as described above.

Cooling water may be provided from a cooling water circuit powered by pump 424. The cooling water circuit may be formed as a direct-return, or indirect-return, circuit, and may generally be a closed-loop system. Pump 424 may take any appropriate form, such as a standard centrifugal pump. Heat exchanger 422 may remove heat from the cooling water in the circuit. Heat exchanger 422 may take any appropriate form, such as a plate-and-frame heat exchanger or a shell-and-tube heat exchanger.

Heat may be passed from the cooling water circuit to a condenser water circuit that includes heat exchanger 422, pump 420, and cooling tower 418. Pump 420 may also take any appropriate form, such as a centrifugal pump. Cooling tower 418 may be, for example, one or more forced draft towers or induced draft towers. The cooling tower 418 may be considered a free cooling source, because it requires power only for movement of the water in the system and in some implementations the powering of a fan to cause evaporation; it does not require operation of a compressor in a chiller or similar structure.

The cooling tower 418 may take a variety of forms, including as a hybrid cooling tower. Such a tower may combine both the evaporative cooling structures of a cooling tower with a water-to-water heat exchanger. As a result, such a tower may be fit in a smaller face and be operated more modularly than a standard cooling tower with separate heat exchanger. Additional advantage may be that hybrid towers may be run dry, as discussed above. In addition, hybrid towers may also better avoid the creation of water plumes that may be viewed negatively by neighbors of a facility.

As shown, the fluid circuits may create an indirect water-side economizer arrangement. This arrangement may be relatively energy efficient, in that the only energy needed to power it is the energy for operating several pumps and fans. In addition, this system may be relatively inexpensive to implement, because pumps, fans, cooling towers, and heat exchangers are relatively technologically simple structures that are widely available in many forms. In addition, because the structures are relatively simple, repairs and maintenance may be less expensive and easier to complete. Such repairs may be possible without the need for technicians with highly specialized knowledge.

Control valve 426 is provided in the condenser water circuit to supply make-up water to the circuit. Make-up water may generally be needed because cooling tower 418 operates by evaporating large amounts of water from the circuit. The control valve 426 may be tied to a water level sensor in cooling tower 418, or to a basin shared by multiple cooling towers. When the water falls below a predetermined level, control valve 426 may be caused to open and supply additional makeup water to the circuit. A back-flow preventer (BFP) may also be provided in the make-up water line to prevent flow of water back from cooling tower 418 to a main water system, which may cause contamination of such a water system.

Optionally, a separate chiller circuit may be provided. Operation of system 400 may switch partially or entirely to this circuit during times of extreme atmospheric ambient (i.e., hot and humid) conditions or times of high heat load in the data center 401. Additional controlled mixing valves 434 are provided for electronically switching to the chiller circuit, or for blending cooling from the chiller circuit with cooling from the condenser circuit. Pump 428 may supply tower water to chiller 430, and pump 432 may supply chilled water, or cooling water, from chiller 430 to the remainder of system 400. Chiller 430 may take any appropriate form, such as a centrifugal, reciprocating, or screw chiller, or an absorption chiller.

The chiller circuit may be controlled to provide various appropriate temperatures for cooling water. In some implementations, the chilled water may be supplied exclusively to a cooling coil, while in others, the chilled water may be mixed, or blended, with water from heat exchanger 422, with common return water from a cooling coil to both structures. The chilled water may be supplied from chiller 430 at temperatures elevated from typical chilled water temperatures. For example, the chilled water may be supplied at temperatures of 55° F. (13° C.) to 65 to 70° F. (18 to 21° C.) or higher. The water may then be returned at temperatures like those discussed below, such as 59 to 176° F. (15 to 80° C.). In this approach that uses sources in addition to, or as an alternative to, free cooling, increases in the supply temperature of the chilled water can also result in substantial efficiency improvements for the system 400.

Pumps 420, 424, 428, 432, may be provided with variable speed drives. Such drives may be electronically controlled by a central control system to change the amount of water pumped by each pump in response to changing set points or changing conditions in the system 300. For example, pump 424 may be controlled to maintain a particular temperature in workspace 306, such as in response to signals from a thermostat or other sensor in workspace 406.

In operation, system 400 may respond to signals from various sensors placed in the system 400. The sensors may include, for example, thermostats, humidistats, flowmeters, and other similar sensors. In one implementation, one or more thermostats may be provided in warm air plenums 404a, 404b, and one or more thermostats may be placed in workspace 406. In addition, air pressure sensors may be located in workspace 306, and in warm air plenums 404a, 404b. The thermostats may be used to control the speed of associated pumps, so that if temperature begins to rise, the pumps turn faster to provide additional cooling waters. Thermostats may also be used to control the speed of various items such as fan 410 to maintain a set pressure differential between two spaces, such as attic 405 and workspace 406, and to thereby maintain a consistent airflow rate. Where mechanisms for increasing cooling, such as speeding the operation of pumps, are no longer capable of keeping up with increasing loads, a control system may activate chiller 430 and associated pumps 428, 432, and may modulate control valves 434 accordingly to provide additional cooling.

Various values for temperature of the fluids in system 400 may be used in the operation of system 400. In one exemplary implementation, the temperature set point in warm air plenums 404a, 404b may be selected to be at or near a maximum exit temperature for trays in racks 402a, 402b. This maximum temperature may be selected, for example, to be a known failure temperature or a maximum specified operating temperature for components in the trays, or may be a specified amount below such a known failure or specified operating temperature. In certain implementations, a temperature of 45° C. may be selected. In other implementations, temperatures of 25° C. to 125° C. may be selected. Higher temperatures may be particularly appropriate where alternative materials are used in the components of the computers in the data center, such as high temperature gate oxides and the like.

In one implementation, supply temperatures for cooling water may be 68° F. (20° C.), while return temperatures may be 104° F. (40° C.). In other implementations, temperatures of 50° F. to 84.20° F. or 104° F. (10° C. to 29° C. or 40° C.) may be selected for supply water, and 59° F. to 176° F. (15° C. to 80° C.) for return water. Chilled water temperatures may be produced at much lower levels according to the specifications for the particular selected chiller. Cooling tower water supply temperatures may be generally slightly above the wet bulb temperature under ambient atmospheric conditions, while cooling tower return water temperatures will depend on the operation of the system 300.

Using these parameters and the parameters discussed above for entering and exiting air, relatively narrow approach temperatures may be achieved with the system 400. The approach temperature, in this example, is the difference in temperature between the air leaving a coil and the water entering a coil. The approach temperature will always be positive because the water entering the coil is the coldest water, and will start warming up as it travels through the coil. As a result, the water may be appreciably warmer by the time it exits the coil, and as a result, air passing through the coil near the water's exit point will be warmer than air passing through the coil at the water's entrance point. Because even the most-cooled exiting air, at the cooling water's entrance point, will be warmer than the entering water, the overall exiting air temperature will need to be at least somewhat warmer than the entering cooling water temperature.

In certain implementations, the entering water temperature may be between about 62-67° F. (e.g., about 64° F. (18° C.)) and the exiting air temperature between about 74-79° F. (e.g., about 77° F. (25° C.)), as noted above, for an approach temperature of between about 7-17° F. (e.g., about 12.6° F. (7° C.)). In other implementations, wider or narrower approach temperature may be selected based on economic considerations for an overall facility.

As illustrated, the system 400 also includes a control valve 440 and a control system 445 operable to modulate the valve 440 in response to or to maintain, for example, an approach temperature set point of the cooling coils 412a and 412b. For example, an airflow temperature sensor 455 may be positioned at a leaving face of one or both of the cooling coils 412a and 412b. The temperature sensor 455 may thus measure a leaving air temperature from the cooling coils 412a and/or 412b. A temperature sensor 460 may also be positioned in a fluid conduit that circulates the cooling water to the cooling coils 412a and 412b (as well as fan coil 414).

The control system 445, as illustrated, may receive temperature information from one or both of the temperature sensors 455 and 460. In some implementations, the control system 445 may be a main controller (i.e., processor-based electronic device or other electronic controller) of the cooling system of the data center, which is communicably coupled to each control valve (such as control valve 440) of the data center and/or individual controllers associated with the control valves. For example, the main controller may be a master controller communicably coupled to slave controllers at the respective control valves. In some implementations, the control system 445 may be a Proportional-Integral-Derivative (PID) controller. Alternatively, other control schemes, such as PI or otherwise, may be utilized. As another example, the control scheme may be implemented by a controller utilizing a state space scheme (e.g., a time-domain control scheme) representing a mathematical model of a physical system as a set of input, output and state variables related by first-order differential equations. In some example implementations, the control system 445 (or other controllers described herein) may be a programmable logic controller (PLC), a computing device (e.g., desktop, laptop, tablet, mobile computing device, server or otherwise), or other form of controller. In cases in which a controller may control a fan motor, for instance, the controller may be a circuit breaker or fused disconnect (e.g., for on/off control), a two-speed fan controller or rheostat, or a variable frequency drive.

In operation, the control system 445 may receive the temperature information and determine an actual approach temperature. The control system 445 may then compare the actual approach temperature set point against a predetermined approach temperature set point. Based on a variance between the actual approach temperature and the approach temperature set point, the control system 445 may modulate the control valve 440 (and/or other control valves fluidly coupled to cooling modules such as the cooling coils 412a and 412b and fan coil 414) to restrict or allow cooling water flow. For instance, in the illustrated implementation, modulation of the control valve 440 may restrict or allow flow of the cooling water from or to the cooling coils 412a and 412b as well as the fan coil 414. After modulation, if required, the control system 445 may receive additional temperature information and further modulate the control valve 440 (e.g., implement a feedback loop control).

In some implementations, the control system 445 may further control the energy regeneration system 108. For example, the control system 445 may receive temperature and pressure information to control pumps, valves, and compressors that are included in or coupled to the energy regeneration system 108. Furthermore, the control system 445 may control distribution of power among the external electrical towers, the main electrical station 102, and the energy regeneration system 108.

Figure 5:
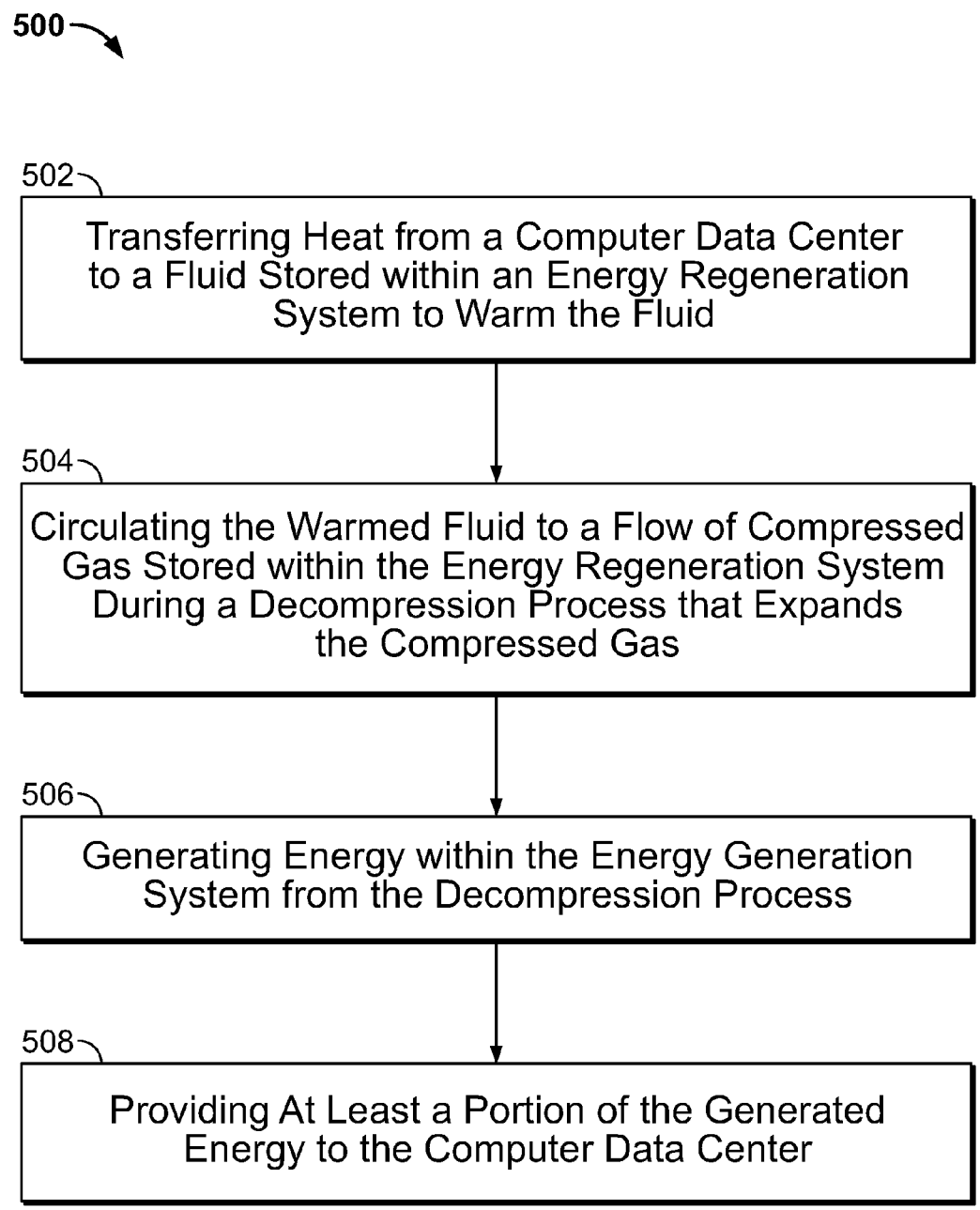
FIG. 5 illustrates an example process for providing power to a computer data center with an energy regeneration system.

FIG. 5 illustrates an example process (500) for providing power to a data center. In some implementations, waste heat is transferred from the computer data center 101 to a fluid stored within the energy regeneration system 108 to warm the fluid (502). For example, relatively low temperature waste heat $Q_{DC}$ may be transferred to a cooling liquid circulated through the heat pipes or the cooling coils 212a, 212b within the computer data center 101, transferred from the warmed data center liquid to the refrigerant in the heat pump 304, and then transferred from the refrigerant as relatively high temperature waste heat $Q_{in}$ to the water within the one or more water tanks 310 of the stored energy system 302.

The warmed fluid is circulated to a flow of compressed gas stored within the energy regeneration system 108 during a discharging process that expands the compressed gas (504). For example, the heated water stored within the one or more water tanks 310 may be sprayed into a flow of the stored gas as the gas is being expanded by the one of the charger-dischargers 306a, 306b that serves as the expander/generator. Energy is generated within the energy generation system 108 from the discharging process (506). In some implementations, at least a portion of the generated energy is provided to the computer data center 101 (508). For example, as the stored gas is being expanded, the one of the charger-dischargers 306a, 306b serving as the turbine or generator may generate energy $W_{out}$ that can be provided as electricity to power the computer data center 101.

In some implementations, an energy state of the energy regeneration system 108 may be described by the following equations:

$$Q_{in}=W_{hp}+Q_{DC} \quad (1)$$

$$W_{out}=W_{in}+Q_{in}+E_{in}-E_{out} \quad (2)$$

$$\text{For a particular } Q_{in}, T_1\text{:} W_{out}>W_{in} \quad (3)$$

EQ. 1 provides that the amount of relatively high temperature waste heat $Q_{in}$ provided from the heat pump 304 to the stored energy system 302 may be equal to the amount of energy $W_{hp}$ provided to the compressor 406 of the heat pump 304 plus the amount of relatively low temperature waste heat $Q_{DC}$ provided from the computer data center 101 to the heat pump 304. EQ. 2 provides that the amount of energy $W_{out}$ provided from the stored energy system 302 to the computer data center 101 may be equal to the amount of energy $W_{in}$ provided to the charger-discharger device 306a, 306b acting as the motor/compressor, plus the amount of relatively high temperature waste heat $Q_{in}$ provided from the heat pump 304 to the stored energy system 302, plus the energy $E_{in}$ provided by the gas entering the one of the charger-dischargers 306a, 306b serving as the motor/compressor, minus the energy $E_{out}$ provided by the decompressed gas released from the energy storage system 302.

Furthermore, EQ. 3 provides that for a particular amount of relatively high temperature waste heat $Q_{in}$ provided by the heat pump 304 and a particular temperature ($T_1$) of the waste heat $Q_{in}$, the amount of energy $W_{out}$ provided from the stored energy system 302 to the computer data center 101 may be greater than the amount of energy $W_{in}$ provided to the one of the charger-dischargers 306a, 306b serving as the motor/compressor. In this manner, the energy regeneration system 108 can generate "net" electricity, thereby reducing the price of electricity for powering the computer data center 101 when the energy regeneration system 108 is operating in the "always on" mode.

Control algorithms that are executed to control one or more of the above-referenced apparatus or systems (e.g., energy regeneration systems, heat pumps, power systems and otherwise) may be implemented as program instructions that can be encoded on an artificially-generated propagated signal, e.g., a machine-generated electrical, optical, or electromagnetic signal that is generated to encode information for transmission to suitable receiver apparatus for execution by a data processing apparatus. The computer storage medium can be a machine-readable storage device, a machine-readable storage substrate, a random or serial access memory device, or a combination of one or more of them.

Such program instructions can be executed by "data processing hardware," including by way of example a programmable processor, a computer, or multiple processors or computers. The hardware can also be or further include special purpose logic circuitry, e.g., a central processing unit (CPU), a FPGA (field programmable gate array), or an ASIC (application-specific integrated circuit). In some implementations, the data processing apparatus and/or special purpose logic circuitry may be hardware-based and/or software-based. For example, data processing hardware may include the control system 445 as well as other control systems and controllers described herein and/or implementable in accordance with the present disclosure.

The processes and logic flows implemented by the program instructions can be performed by one or more programmable computers executing one or more computer programs to perform functions by operating on input data and generating output. The processes and logic flows can also be performed by, and apparatus can also be implemented as, special purpose logic circuitry, e.g., a central processing unit (CPU), a FPGA (field programmable gate array), or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices.

Computer-readable media (transitory or non-transitory, as appropriate) suitable for storing computer program instructions and data, such as instructions and data associated with the equation implemented in a device, include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The memory may store various objects or data, including caches, classes, frameworks, applications, backup data, jobs, web pages, web page templates, database tables, repositories storing business and/or dynamic information, and any other appropriate information including any parameters, variables, algorithms, instructions, rules, constraints, or references thereto. Additionally, the memory may include any other appropriate data, such as logs, policies, security or access data, reporting files, as well as others. The processor and the memory can be supplemented by, or incorporated in, special purpose logic circuitry.

To provide for interaction with a user, implementations of the subject matter described in this specification can be implemented on a device having, or connected to, a display device, e.g., a CRT (cathode ray tube), LCD (liquid crystal display), or plasma monitor, for displaying information to the user and an input device (e.g., keypad, a pointing device, or otherwise), by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

A number of examples have been described. Nevertheless, it will be understood that various modifications may be made. Accordingly, other examples are within the scope of the following claims.

What is claimed is:

1. A method of providing power to a data center, comprising:
   receiving heat from a computer data center into a working fluid of a heat pump;
   transferring heat from the computer data center to the heat pump to warm a fluid that is stored in a fluid storage tank with the working fluid;
   transferring heat from the computer data center to the heat pump to warm the fluid with the working fluid as the fluid flows from the fluid storage tank through at least one liquid-to-liquid heat exchanger fluidly coupled to the fluid storage tank;
   circulating the warmed fluid to a flow of compressed gas during a discharging process that expands the compressed gas;
   generating energy from the discharging process; and
   providing at least a portion of the generated energy to the computer data center as electrical power.

2. The method of claim 1, further comprising:
   increasing the received heat into the working fluid through a compression process that adds heat to the working fluid.

3. The method of claim 2, further comprising transferring the received heat from the computer data center and the added heat in the working fluid to the fluid.

4. The method of claim 3, further comprising transferring the received heat from the computer data center and the added heat in the working fluid to the fluid in at least one of the at least one liquid-to-liquid heat exchanger or the fluid storage tank.

5. The method of claim 3, further comprising transferring the received heat from the computer data center and the added heat in the working fluid to the fluid in at least one of a first liquid-to-liquid heat exchanger of the at least one liquid-to-liquid heat exchanger or the fluid storage tank.

6. The method of claim 5, further comprising:
   circulating a working liquid through a second liquid-to-liquid heat exchanger of the at least one liquid-to-liquid heat exchanger to receive heat from the working fluid;
   circulating the heated working liquid from the second liquid-to-liquid heat exchanger to the first liquid-to-liquid heat exchanger; and
   transferring heat from the heated working liquid to the fluid in the first liquid-to-liquid heat exchanger.

7. The method of claim 2, further comprising:
   cooling the working fluid through an expansion process; and
   circulating the cooled working fluid to receive heat from the computer data center.

8. The method of claim 1, wherein transferring heat from the computer data center to the heat pump to warm the fluid comprises:
   circulating an airflow over heat-generating electronic devices within the computer data center to receive the heat generated by the heat-generating electronic devices; and
   transferring the heat in the airflow to the working fluid in an air-to-liquid heat exchanger.

9. The method of claim 1, further comprising compressing an ambient airflow with a first charger-discharger to produce the compressed gas.

10. The method of claim 9, further comprising expanding the compressed gas with the first charger-discharger.

11. The method of claim 9, further comprising expanding the compressed gas with a second charger-discharger that is independent of the first charger-discharger.

12. A system, comprising:
    a power generation system comprising a heat pump, a pump, and a compressor-expander set, the compressor-expander set operable to expand a compressed gas and generate energy while expanding the compressed gas;
    an electrical network electrically coupled to the power generation system to provide at least a portion of the generated energy to a computer data center as electrical power;
    a control system communicably coupled to the power generation system and operable to perform operations comprising:
      controlling the heat pump to transfer heat from the computer data center to a heat pump working fluid;
      controlling the heat pump to transfer heat from the working fluid of the heat pump to a fluid that is stored in a storage tank;
      controlling the heat pump to transfer heat from the heat pump working fluid of the heat pump to the fluid as the fluid flows from the storage tank through at least one heat exchanger fluidly coupled to the fluid storage tank; and
      controlling the pump to circulate the warmed fluid to a flow of compressed gas while the compressed gas is expanded.

13. The system of claim 12, wherein the heat pump comprises a vapor compressor, the control system operable to perform operations comprising controlling the heat pump to compress a vapor phase of the heat pump working fluid to add heat to the heat pump working fluid.

14. The system of claim 13, wherein the at least one heat exchanger comprises a first heat exchanger fluidly coupled to the vapor compressor and thermally coupled to the fluid to transfer heat from the heat pump working fluid to the fluid.

15. The system of claim 14, wherein the heat from the heat pump working fluid is transferred to the fluid in at least one of the first heat exchanger, a second heat exchanger fluidly coupled between the pump and the first heat exchanger, or storage tank fluidly coupled to the pump.

16. The system of claim 13, wherein the heat pump comprises an orifice fluidly coupled to the vapor compressor, the orifice operable to expand the heat pump working fluid and cool the heat pump working fluid through the expansion.

17. The system of claim 16, further comprising:
at least one fan positioned to circulate an airflow over a plurality of heat-generating electronic devices within the computer data center; and
an air-to-liquid heat exchanger positioned to receive the airflow warmed by the heat-generating electronic devices and transfer the heat of the warmed airflow to the cool heat pump working fluid.

18. The system of claim 12, wherein the compressor-expander set is fluidly coupled to receive an ambient airflow to compress into the compressed gas.

19. The system of claim 18, wherein the compressor-expander set comprises a first compressor-expander and a second compressor-expander, the first compressor-expander operable to compress the ambient air into the compressed gas, the second compressor-expander operable to expand the compressed gas to generate energy.

20. The system of claim 19, wherein the second compressor-expander is independent of the first compressor-expander.

21. The method of claim 1, wherein heat is transferred from the working fluid of the heat pump to the fluid in the fluid storage tank and to the fluid in the at least one liquid-to-liquid heat exchanger in parallel.

* * * * *